United States Patent
Lee et al.

(10) Patent No.: US 7,663,199 B2
(45) Date of Patent: Feb. 16, 2010

(54) HIGH POWER LIGHT EMITTING DIODE PACKAGE AND FABRICATION METHOD THEREOF

(75) Inventors: Seon Goo Lee, Kyungki-do (KR); Hun Joo Hahm, Kyungki-do (KR); Dae Yeon Kim, Kyungki-do (KR); Young Jae Song, Kyungki-do (KR); Young Sam Park, Seoul (KR); Chang Ho Song, Seoul (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 562 days.

(21) Appl. No.: 11/442,414

(22) Filed: May 30, 2006

(65) Prior Publication Data

US 2006/0267036 A1 Nov. 30, 2006

(30) Foreign Application Priority Data

May 30, 2005 (KR) .................. 10-2005-0045787

(51) Int. Cl.
*H01L 29/78* (2006.01)
(52) U.S. Cl. .................. 257/433; 257/676; 438/122
(58) Field of Classification Search ........... 257/79–100, 257/431, 432, 433, 434, 435, 436, 437, 666, 257/675, E25.032; 438/24–26, 29, 48, 54, 438/22, 64

See application file for complete search history.

(56) References Cited

U.S. PATENT DOCUMENTS

| | | | | |
|---|---|---|---|---|
| 5,731,067 A | * | 3/1998 | Asai et al. | 428/210 |
| 7,365,407 B2 | * | 4/2008 | Ng et al. | 257/433 |
| 2003/0183907 A1 | | 10/2003 | Hayashi et al. | |
| 2004/0075100 A1 | * | 4/2004 | Bogner et al. | 257/99 |
| 2006/0022216 A1 | * | 2/2006 | Chikugawa | 257/99 |

FOREIGN PATENT DOCUMENTS

| | | |
|---|---|---|
| JP | 2003-289085 A | 10/2003 |
| JP | 2005-116937 | 4/2005 |

\* cited by examiner

*Primary Examiner*—W. David Coleman
*Assistant Examiner*—Su C Kim
(74) *Attorney, Agent, or Firm*—McDermott Will & Emery LLP

(57) ABSTRACT

The invention relates to a high power LED package and a fabrication method thereof. The LED package includes a light emitting part for generating light in response to power applied, a heat conducting member with the light emitting part mounted thereon, a lead part for electrically connecting the light emitting part and a board, and a mold part for integrally fixing the heat conducting member and the lead part. The heat conducting member is composed of at least two metal layers in a height direction, and the lead part includes at least one first lead extended out of the heat conducting member and at least one second lead separated from the heat conducting member. The invention allows integration of two components into a single one, reducing the number of components and simplifying the assembly process, thereby reducing the manufacturing costs.

43 Claims, 17 Drawing Sheets

(a)

(b)

(a)

(b)

(a)

(b)

(a)

(b)

(a)

(b)

(a)

(b)

(a)

(b)

HIGH POWER LIGHT EMITTING DIODE PACKAGE AND FABRICATION METHOD THEREOF

CLAIM OF PRIORITY

This application claims the benefit of Korean Patent Application No. 2005-45787 filed on May 30, 2005, in the Korean Intellectual Property Office, the disclosure of which is incorporated herein by reference.

BACKGROUND OF THE INVENTION

1. Field of the Invention

The present invention relates to a high power Light Emitting Diode (LED) package and a fabrication method thereof. More particularly, the invention relates to a high power LED package in which a lead part is integrated with a heat conducting member into a single component to reduce the number of components constituting the package, simplifying the assembly structure and process to reduce the manufacturing costs, and a fabrication method thereof.

2. Description of the Related Art

In general, a Light Emitting Diode (LED) is a semiconductor light emitting device that emits light in response to power applied, and adopts a PN junction diode composed of for example, GaAs or GaN optical semiconductor to convert electric energy into light.

The light from the LED ranges from red (630 nm~700 nm) to blue-violet (400 nm), including blue, green and white. With such merits as low power consumption, high efficiency, and longer operation and life time compared with the conventional light sources such as incandescent lamps and fluorescent lamps, the demand for the LED is steadily increasing.

Recently, the LED has been expanded in its application from small-sized illumination of mobile terminals to areas such as indoor/outdoor illumination, automobile illumination, and backlights for large-sized Liquid Crystal Displays (LCD).

In the meantime, power applied to the semiconductor is increased in proportion to the intensity of light generated in response to current applied. Thus, with high level of power consumption, the LED typically adopts a heat conducting structure to prevent the semiconductor device and the package itself from being damaged from the heat generated during the emission of light.

FIG. 1(a) is a perspective view illustrating a conventional high-power LED package longitudinally sectioned, and FIG. 1(b) is a longitudinal sectional view of the conventional high-power LED package assembled onto a board.

As shown, the conventional high-power LED package 10 includes a semiconductor device 11 and a heat conducting structure 12 with the semiconductor device 11 mounted on the center of the upper surface thereof.

The semiconductor device 11 is electrically connected with a plurality of lead frames 14 via a plurality of metal wires 13 so as to be connected with external power source and applied with power.

The heat conducting structure 12 is a means to discharge the heat generated when the semiconductor device 11 emits light, thus cooling down the package. It is mounted on a board 19 via an adhesion means 12a made of material of high heat conductivity.

In the conventional LED package, the lead frame 14 is integrated with a mold part 15. The mold part 15 has an assembly hole formed therethrough so that the heat conducting structure 12 is inserted into the center of the mold part 15 to be assembled together. The lead frame 14 has one end exposed out of the mold part 15 to be connected to the wire 13, and has the other end electrically connected via a pad 14a to a circuit pattern 19a printed on the board 19.

A lens 16 is provided on the upper surface of the mold part 15 to extensively spread the light generated from the semiconductor device 11 to the outside. The space between the mold part 15 and the lens 16 is filled with packing material 17 made of transparent silicone resin to project the emitted light while protecting the semiconductor device 11 and the wires 13.

However, the conventional LED package 10 having such a structure entails forming the assembly hole 15a for inserting the heat conducting structure 12 into the center of the mold part 15, followed by the insertion of the separate heat conducting structure 12. Therefore, the assembly structure and process is too complicated to be fully automated, lowering productivity. In addition, the package has a large volume with too many components therein.

In the meantime, U.S. patent publication No. 2004/0075100 (published on Apr. 22, 2004) discloses an LED package structure including a heat conducting structure with a semiconductor device mounted thereon as a light source, a lead frame connected to the heat conducting structure and a mold part injection-molded to integrally fix the heat conducting structure with the lead frame, and a reflecting part in a cup-shape for reflecting the light generated from the semiconductor device.

In such a conventional package structure, the heat conducting member and the lead frame can be integrated with the mold part during the injection-molding of the mold part, and thus, the insertion step of the heat conducting structure can be omitted. Still, the heat conducting structure and the lead frame need to be provisionally assembled before the molding and a complicated shape of the heat conducting structure needs to be made separately. Thus, it is difficult to manage the tolerance in pre-assembly and excessively high manufacturing costs are incurred for the fabrication of the heat conducting structure. Also, flat machining is required for the component on which the semiconductor device is mounted, further increasing the manufacturing costs.

SUMMARY OF THE INVENTION

The present invention has been made to solve the foregoing problems of the prior art and it is therefore an object of the present invention to provide a high power LED package in which two components are unified into one to reduce the number of constituting components, simplifying the assembly process, thereby reducing the manufacturing costs, and a fabrication method thereof.

According to an aspect of the invention for realizing the object, there is provided a high power light emitting diode package including: a light emitting part for emitting light in response to power applied thereto; a heat conducting member with the light emitting part mounted on an upper surface thereof; a lead part for electrically connecting the light emitting part with a board; and a mold part for integrally fixing the heat conducting member and the lead part, wherein the heat conducting member comprises at least two metal layers deposited in a height direction, and the lead part comprises at least one first lead extended from an outer surface of the heat conducting member, and at least one second lead separate from the heat conducting member.

Preferably, the light emitting part comprises at least one semiconductor device.

Preferably, the heat conducting member and the lead part are made of heat conductive metal.

Preferably, the heat conducting member comprises upper, lower and middle metal layers folded from a metal plate.

More preferably, the upper and lower metal layers have substantially the same area as the area of the upper surface of the middle metal layer.

More preferably, the upper metal layer is provided in a smaller area than the area of the upper surface of the middle metal layer and in a larger area than the mounting area of a light emitting part.

More preferably, the upper and lower metal layers and the middle metal layer are bound integrally at interfaces thereof.

Preferably, the heat conducting member is bound to an upper surface of the board by a conductive adhesive.

More preferably, the lower surface of the heat conducting member is coplanar with the lower surface of the mold part.

More preferably, the underside of the heat conducting member is exposed through an opening perforated in the underside of the mold part.

More preferably, the underside of the heat conducting member protrudes through the underside of the mold part.

Preferably, the heat conducting member is adjustable in height by the number of the folded metal layers.

Preferably, the first and second leads are opposed to each other with respect to the heat conducting member.

Preferably, each of the first and second leads has an upper part, which is in the vicinity of the mounting surface of the light emitting part, and a lower part, which is in contact with the upper surface of the board, the upper part and the lower part having different heights.

Preferably, the first lead is integrally provided with at least two supplemental electrodes at an outer end thereof, extended out of the outer surface of the mold part.

Preferably, the second lead comprises at least two divided electrodes extended out of the outer surface of the mold part.

Preferably, the lead part is extended out of the outer surface of the mold part to have a minimum contact area electrically connected to a pattern circuit of the board.

Preferably, the mold part includes a main cup part having a reflective film on a sloped surface surrounding the light emitting part.

Preferably, the mold part includes a supplemental cup part which exposes a portion of the second lead connected with an end of a wire having the other end electrically connected with the light emitting part.

Preferably, the mold part is made of heat conductive resin.

Preferably, the mold part has outer surfaces substantially coplanar with exposed side or bottom surfaces of the heat conducting member.

Preferably, an upper surface of the heat conducting member where the light emitting part is mounted is protruded beyond an uppermost surface of the mold part.

Preferably, the high power LED package further comprises a lens provided on an upper surface of the mold part, covering an upper part of the light emitting part.

More preferably, the high power LED package comprises packing material provided between the mold part and the lens, filling the space therebewteen.

More preferably, the mold part has a groove in an upper surface thereof for preventing excess packing material from overflowing outside after filling up the space between the lens and the mold part as the lens is bonded to the mold part.

More preferably, the groove is provided along the outer periphery of the lower end of the lens.

According to another aspect for realizing the object, there is provided a fabrication method of a high power LED package comprising steps of: a) forming a spread-out heat conducting member and a lead part comprising a first lead extended from the heat conducting member and a second lead separate from the heat conducting member in a plate-shaped frame part; b) folding the spread-out heat conducting member into at least two metal layers; c) molding a mold part to integrally fix the heat conducting member and the lead part; d) mounting a light emitting part on an upper part of the heat conducting member; e) electrically connecting the light emitting part and the lead part; f) bonding the lens to an upper surface of the mold part; and g) cutting the lead part to separate the mold part from the frame part.

Preferably, the step (b) comprises forming a recess on a lower surface of one of the metal layers and inserting another one of the metal layers into the recess for integral binding of the metal layers.

Preferably, the step (b) comprises forming a plurality of rivet holes through one of the metal layers, forming rivet projections on another one of the metal layers, superimposing the metal layers so that the rivet projections are inserted into the rivet holes, and compressing the upper part of the rivet projections inserted into the rivet holes to integrally bind the superimposed metal layers.

Preferably, the step (b) comprises directly melting and bonding by heat-fusion, the interfacial surfaces between the metal layers to integrally bind the metal layers.

More preferably, heat is applied between the metal layers via one selected from a group consisting of resistance welding, hot press welding, ultrasonic welding, and radio frequency welding.

Preferably, the step (b) comprises integrally binding the metal layers by a metal medium provided between the metal layers.

More preferably, the metal medium comprises a coating material applied on the surface of the metal layer.

More preferably, the metal medium comprises a paste or a metal sheet interposed between the metal layers.

Preferably, the step (b) comprises bending the first and second leads such that upper and lower parts of each of the first and second leads have different heights.

Preferably, the step (b) comprises cutting an outer end of the first lead extended out of the outer surface of the mold part to form at least two supplemental electrodes.

Preferably, the step (b) comprises cutting an outer end of the second lead extended out of the outer surface of the mold part to form at least two divided electrodes.

Preferably, the step (c) comprises forming a main cup part surrounding the light emitting part to be mounted on an upper surface of the heat conducting member.

More preferably, the inner surface of the main cup part comprises a sloped surface with a reflective film thereon.

Preferably, the step (c) comprises forming a supplemental cup part which exposes a portion of the second lead connected with the light emitting part by a wire.

Preferably, the step (c) comprises molding the mold part such that an upper surface of the heat conducting member where the light emitting part is mounted is protruded beyond an uppermost surface of the mold part.

Preferably, the step (c) comprises forming a groove in the upper surface of the mold part for preventing excess packing material from overflowing outside after filling in the space between the lens and the mold part as the lens is bonded to the upper surface of the mold part.

Preferably, the step (g) comprises cutting the first and second leads in most close proximity to the outer surface of the mold part.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

Figure 1:
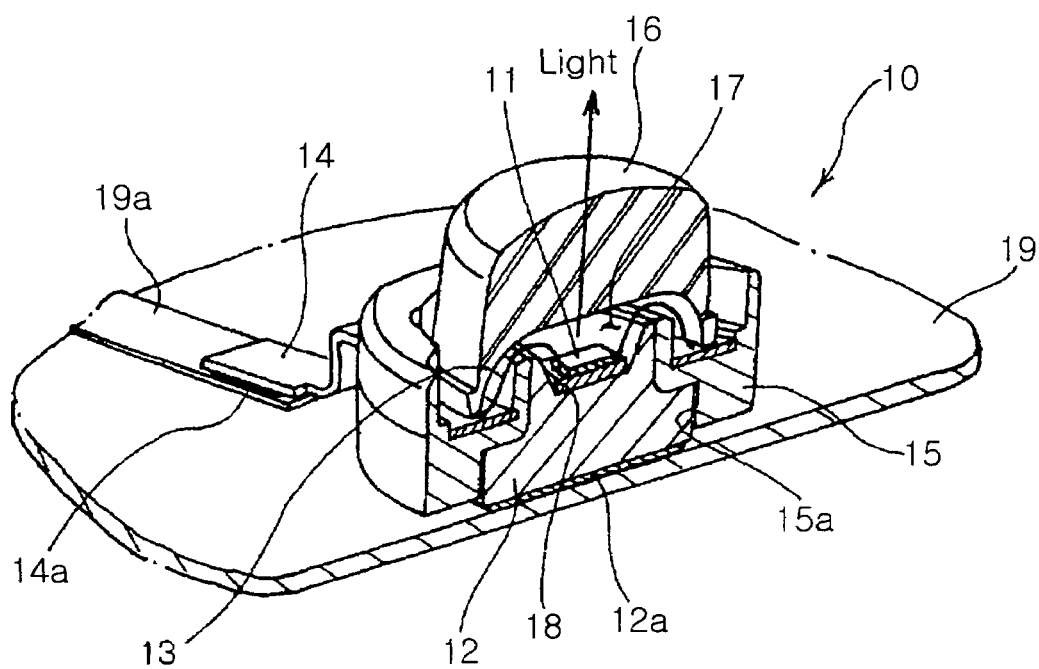
FIG. 1 illustrates a conventional high power LED package in which, (a) is a perspective view illustrating the LED package longitudinally sectioned in the center of the body thereof, and (b) is a longitudinal sectional view illustrating the Led package assembled onto a board.
Figure 1:
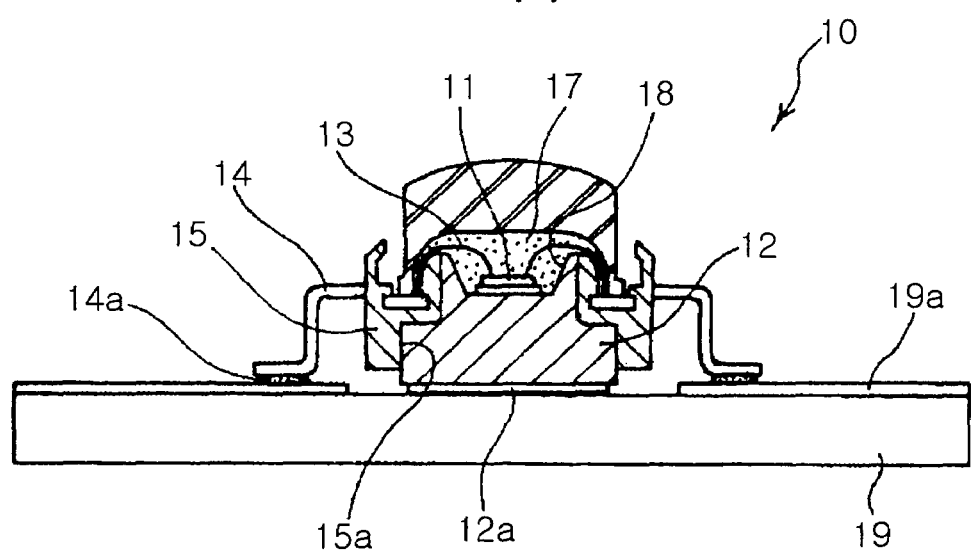
Figure 2:
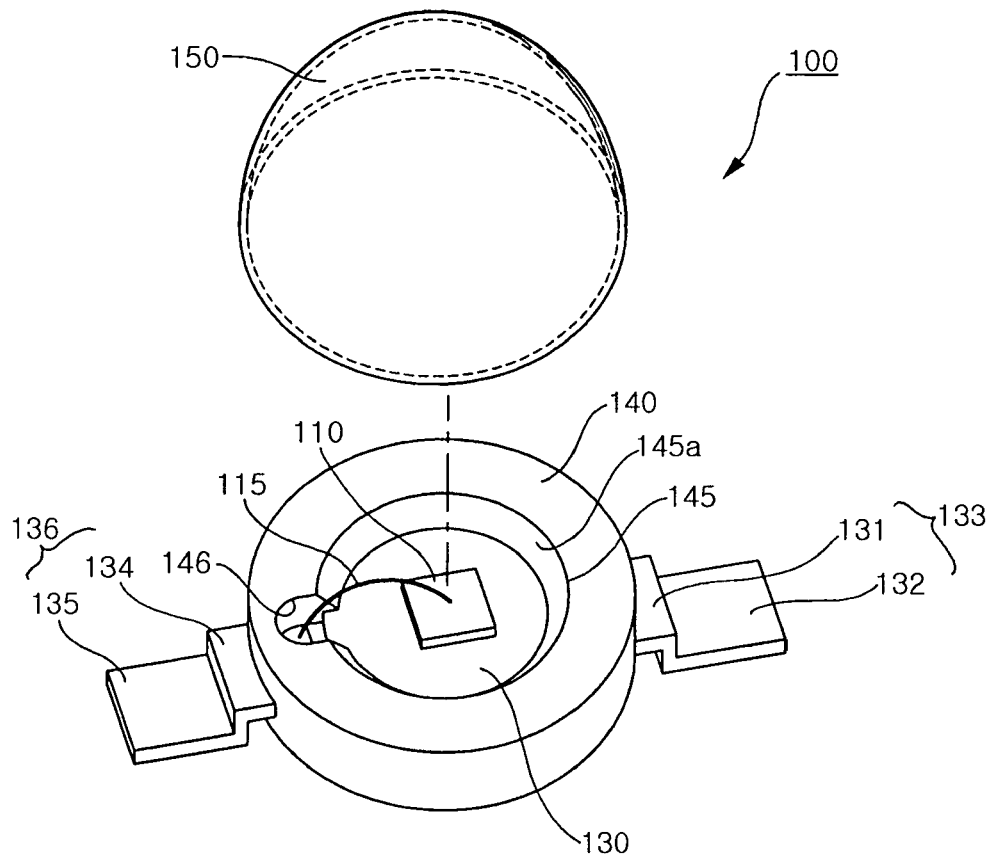
FIG. 2 illustrates a high-power LED package according to a first embodiment of the present invention, in which (a) is a top perspective view, and (b) is a bottom perspective view.
Figure 2:
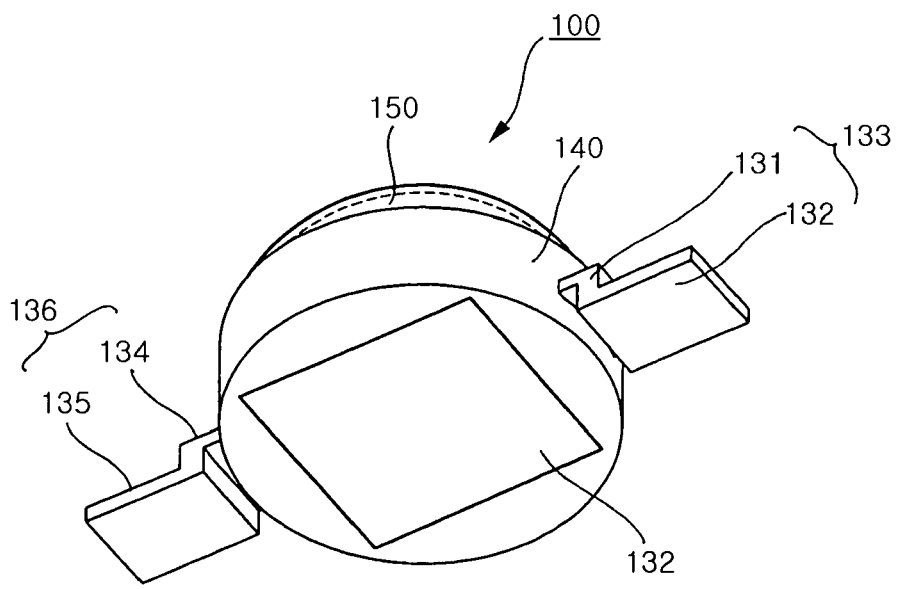
Figure 3:
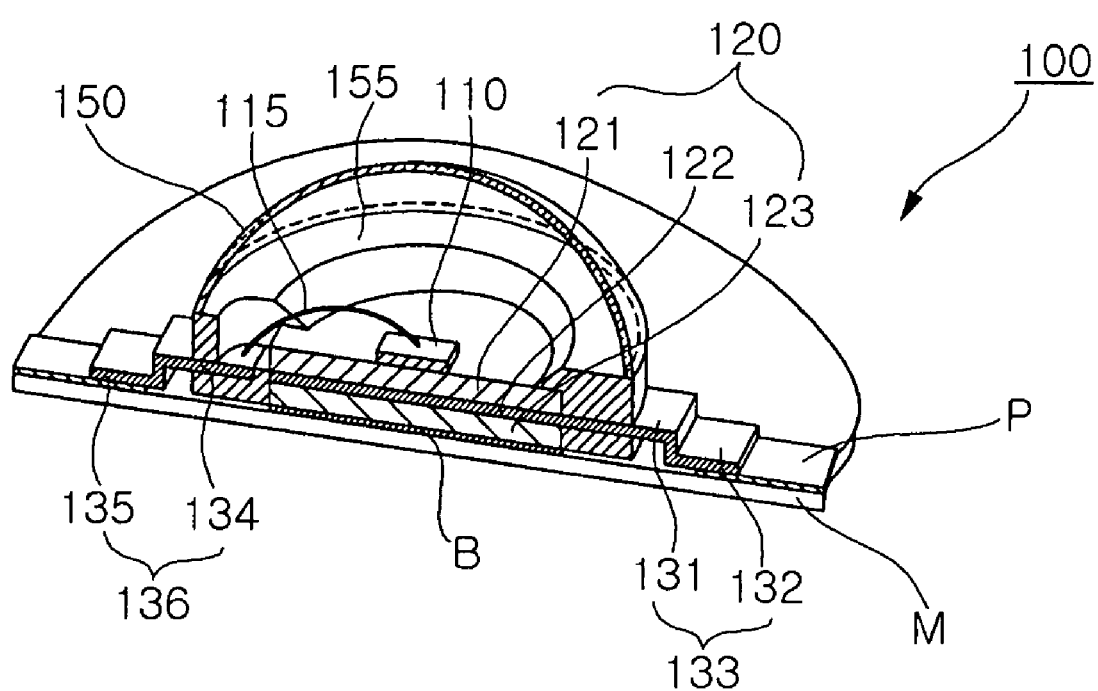
FIG. 3 is a longitudinal sectional view illustrating the high power LED package mounted on the board, according to the first embodiment of the present invention.

As shown in FIGS. 2(a) and (b) and FIG. 3, an LED package 100 according to the present invention including a light emitting part 110, a heat conducting part 120, a lead part 130 and a mold part 140, integrates two components into a single one, reducing the number of components, thereby simplifying the assembly process.

The light emitting part 110 is composed of at least one semiconductor device which generates a predetermined intensity of light in response to power applied and generates heat in proportion to the intensity of current applied at the same time.

Such a semiconductor device is composed of material such as GaAlAs-based material use in an active layer and a cladding layer covering the active layer, AlGain-based, AlGainP-based and AlGainPAs-based material used in red semiconductor laser devices of high-density optical discs, and GaN-based material used in electronic devices such as transistors, but is not limited to such and may be composed of diverse kinds of semiconductor material.

Here, the semiconductor device for the light emitting part can be directly mounted on the upper surface of the heat conductive member 120. However, it can also be adhered to the upper surface of a submount first via soldering material such as Au—Sn and Pb—Sn or adhesion means such as Ag paste and then mounted on the upper surface of the heat conducting member 120.

As shown in FIGS. 2(a) and (b) and FIG. 3, the heat conducting member 120 is a heat conducting means with the light emitting part 110 mounted on the upper most surface thereof. The heat conducting member 120 functions to transmit the heat generated from the light emitting part 110, toward the board M to prevent overheating, and is also called a "heat sink slug."

It is preferable that the heat conducting member 120 is made of metal of high conductivity, and more specifically, one selected from Cu, Ag, Al, Fe, Ni and W and alloys thereof, and its outer surface may be plated with one selected from Ni, Ag, Au and alloys thereof.

The heat conducting member 120 is composed of at least two metal layers superimposed in a height direction. Such metal layers are formed by folding a single metal plate along predetermined fold lines such that the surfaces of the metal layers are in surface contact with each other.

Figure 4:
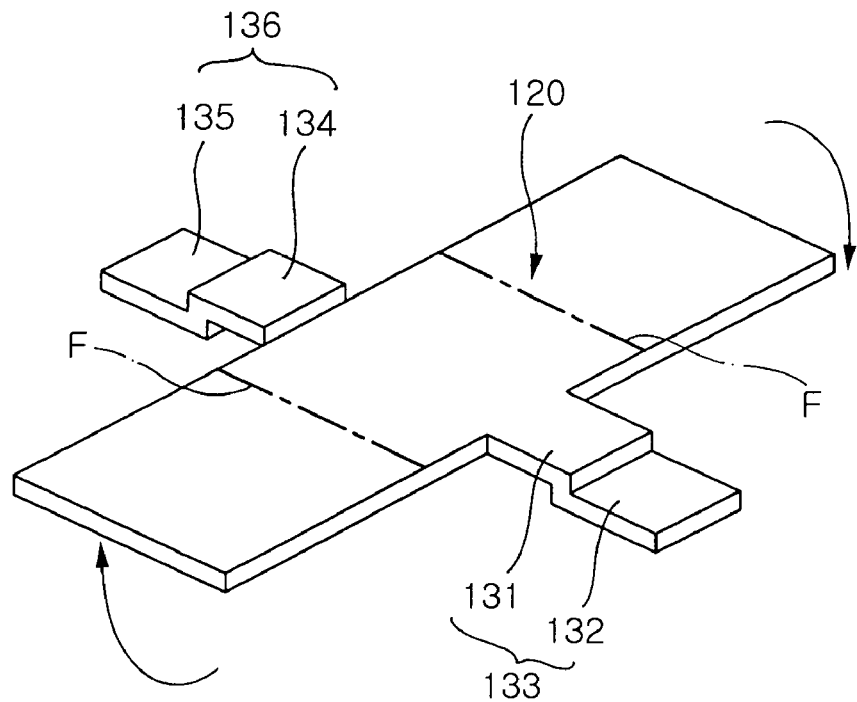
FIG. 4 illustrates a heat conducting member adopted in the high-power LED package according to the first embodiment of the present invention, in which (a) is an unfolded view of the heat conducting member, and (b) is a perspective view of the heat conducting member.
Figure 4:
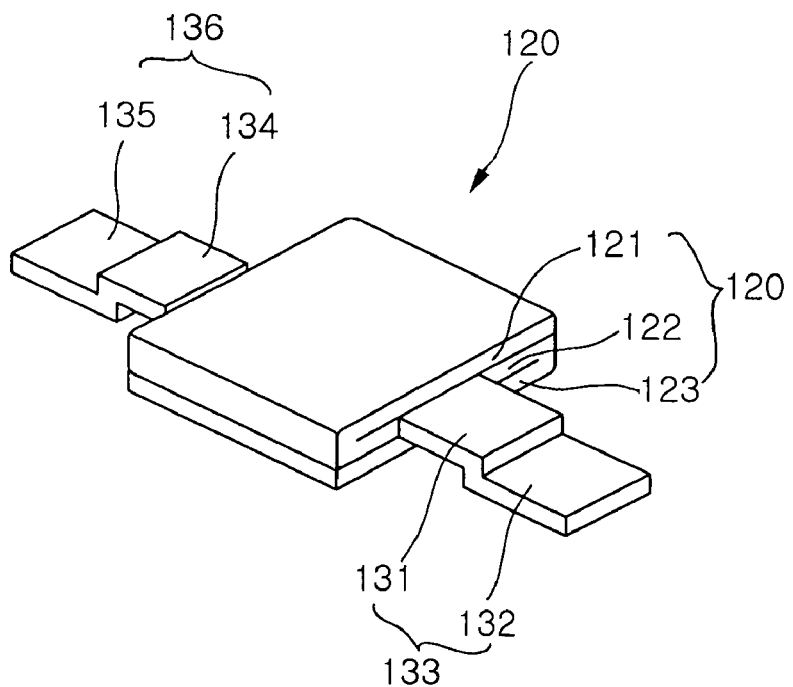

As shown in FIGS. 4(a) and (b), the heat conducting member 120, in case of being composed of upper and lower metal layers 121 and 123 and a middle layer 122, is a single continuous metal plate having the upper metal layer 121 folded along a fold line F to have the underside of the upper metal layer 121 superimposed on the upper surface of the middle metal layer 122, and the lower metal layer 123 folded along another fold line F to have the upper surface of the lower metal layer 122 superimposed underneath the underside of the middle metal layer 123.

Here, the upper and lower metal layers 121 and 123 may have substantially the same area as the upper surface area of the middle layer 122. Alternatively, however, the upper metal layer 121 can be provided in a smaller area than the upper surface area of the middle metal layer 122 and in a larger area than the mounting area of the light emitting part 110 so that the upper metal layer 121 forms only a minimal area for mounting the light emitting part 110.

It is preferable that the upper and lower metal layers 121 and 123 and the middle metal layer 122 are integrally bound in ways that ensure the shortest distance of path for transmitting the heat generated from the light emitting part 110 to the board M.

In addition, it is preferable that the underside of the heat conducting member 120 is exposed through the underside of the mold part 140 so that the underside of the heat conducting member 120 is adhered to the board M via conductive adhesive B.

Figure 5:
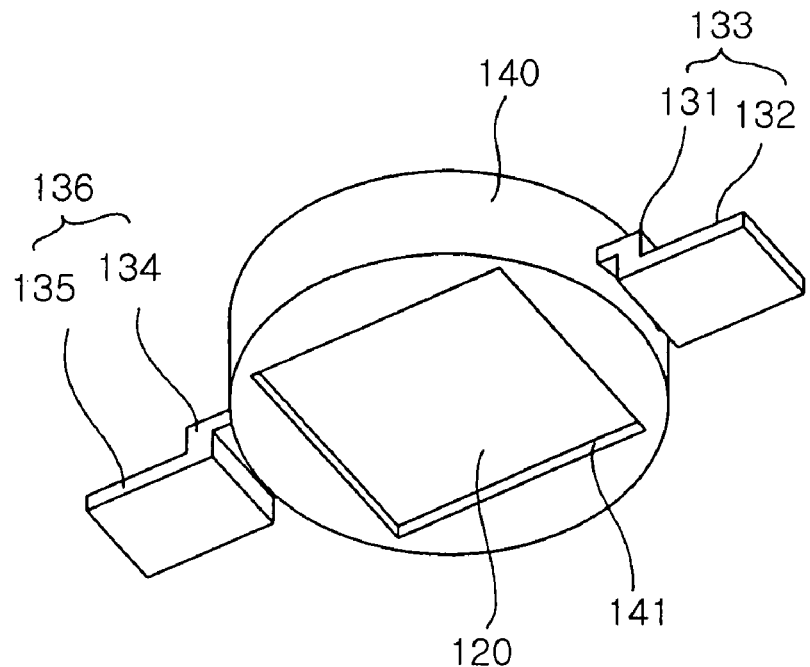
FIG. 5 illustrates another form of the heat conducting member adopted in the high power LED package according to the first embodiment of the present invention, in which (a) is a perspective view of the heat conducting member exposed through an opening of a mold part, and (b) is a perspective view of the heat conducting member protruded beyond the underside of the mold part.
Figure 5:
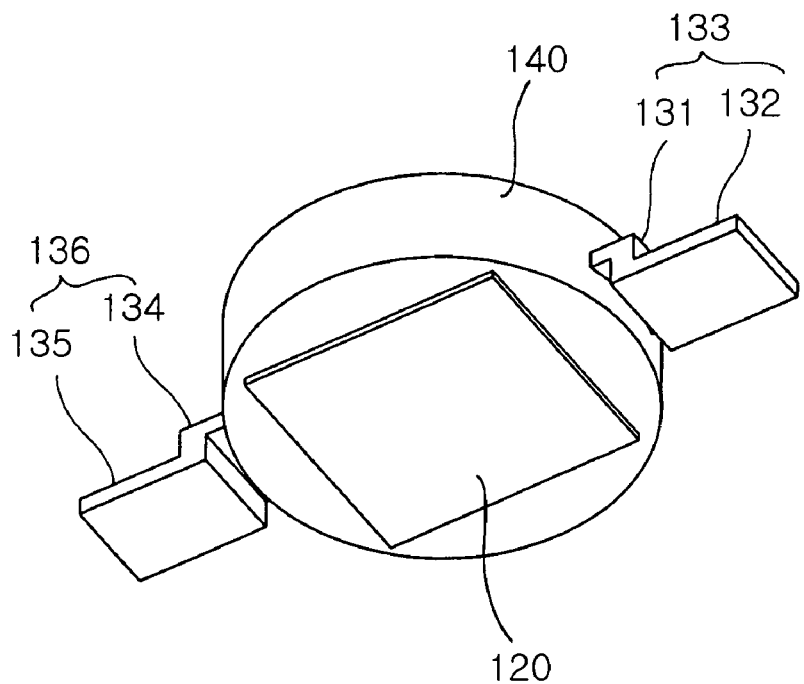

At this time, the underside of the heat conducting member 120 exposed through an opening in the underside of the mold part 140 may be, but not limited to be, disposed coplanar with the underside of the mold part 140. As shown in FIG. 5(a), the underside of the heat conducting member 120 may be exposed through the opening perforated in the underside of the mold part 140. Also, as shown in FIG. 5(b), the bottom of the heat conducting member 120 may be protruded in a predetermined dimension from the underside of the mold part 140 toward the board.

In addition, the height of the heat conducting member 120 can be adjustable with the number of metal layers superimposed onto one another by folding a single plate along the fold lines.

In the meantime, as shown in FIGS. 2(a) and (b) and FIGS. 4(a) and (b), the lead part 130 electrically connecting the light emitting part 110 with the board M is composed of first and second leads 133 and 136 made of the same material as the heat conducting member 120. The first lead 133 is a metal electrode member laterally extended from any one of the plurality of metal layers forming the outer surface of the heat conducting member 120 and connected with the patterned circuit of the board M. The second lead 136, completely separated from the heat conducting member 120, is at least one metal electrode member electrically connected with the light emitting part 110 via wires 115 to be connected with the patterned circuit of the board M.

Preferably, the first and second leads 133 and 136 are disposed opposite of each other with respect to the light emitting part 110. The first and second leads 133 and 136 are bent such that upper parts 131 and 134 in vicinity of the mounting surface of the light emitting part 110 and lower parts 132 and 135 connected to the upper surface of the board M have a predetermined difference in height.

Figure 6:
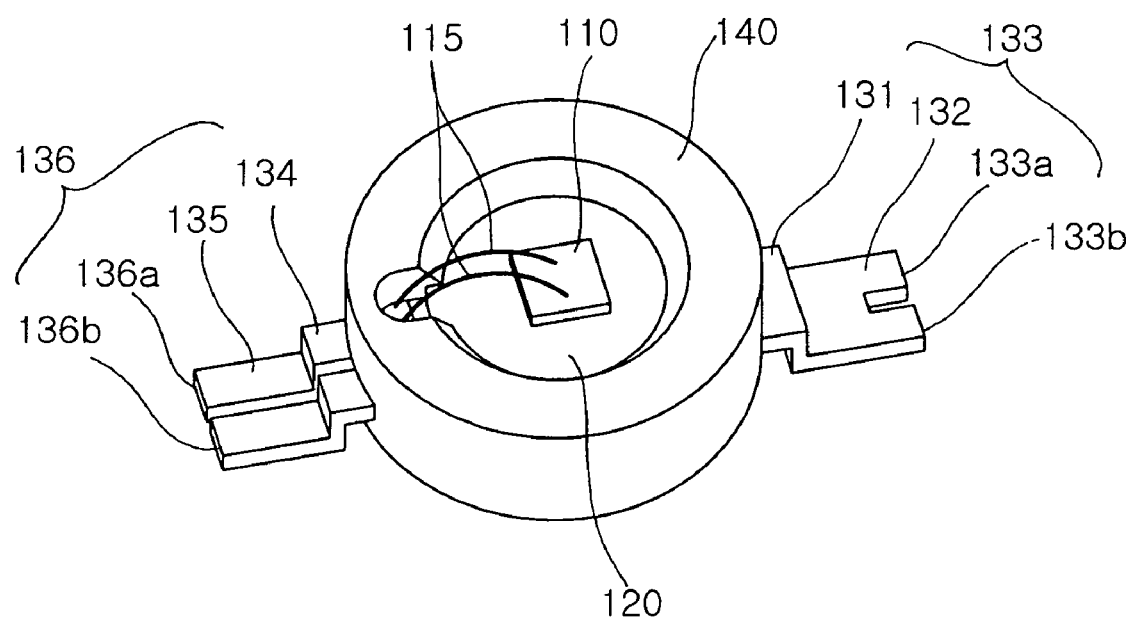
FIG. 6 is a perspective view illustrating another form of the lead part adopted in the high power LED package according to the first embodiment of the present invention.

In addition, as shown in FIG. 6, the first lead 133 may be integrally provided with at least two supplemental electrodes 133a and 133b at the outer end thereof extended out of the outer surface of the mold part 140. And the second lead 136 may be composed of at least two divided electrodes 136a and 136b each of which is extended out of the outer surface of the mold part 140 and connected with an end of each wire 115. The other end of the wire 115 is connected to the light emitting part 110.

Here, it is preferable that the lead part 130 is exposed through the outer surface of the mold part 140 such that the lead part 130 has minimal contact areas for electrical connection with the patterned circuit P of the board M.

Meanwhile, as shown in FIGS. 2(a) and (b) and FIG. 3, the mold part 140 is made of resin injection-molded to integrate the heat conducting member 120, having the light emitting part 110 mounted thereon, with the lead part 130.

It is preferable to form such a mold part 140 using polymer-based resin which is easily employable in injection process for forming the package body, but not limited to such and diverse kinds of resin can be used.

A main cup part 145 is provided on the upper surface of the mold part 140 to expose the light emitting part 110 mounted on the heat conducting member 120. The sloped surface of the main cup part 145 surrounding the light emitting part 120 may have a reflective film 145a thereon to reflect light from the light emitting part 110.

In addition, it is preferable that a supplemental cup part 146 is provided in the main cup part 145 to expose a portion of the upper part 134 of the second lead 136 connected to the other end of the wire 115.

The main cup part 145 and the supplemental cup part 146 are formed by injection-molding the mold part 140 using heat conductive resin.

As shown in FIGS. 2(a) and (b) and FIG. 3, the upper surface of the mold part 140 may be bound with at least one lens 150 to project the light emitted from the light emitting part 110 to the outside, in a wide beam angle. The space between the mold part 140 and the lens 150 is filled with encapsulant or packing material 155 to protect the light emitting part 110 and the wires.

Here, it is preferable that the lens 150 may be composed of epoxy and glass to enable reflow assembly, but is not limited to such and may be composed of general transparent resin such as polycarbonate, Polymethyl Methacrylate (PMMA), optical nylon, Cyclic Olefin Copolymer (COC), ATON and ZEONIX.

The packing material 155 has such fluidity that it can be evenly spread in the space between the mold part 140 and the lens 150, and silicone and epoxy composed of transparent resin can be optionally used for the packing material 155.

It is preferable that the packing material is gel-type resilient resin, which is not readily susceptible to deformations by the light of a single wavelength, such as yellowing, and has a high refractive index and superior optical characteristics. Further, in case of using silicone for the packing material, since it is able to maintain a gel or an elastomer state even after a curing process unlike epoxy, silicone can protect the light emitting part 110 more stably from heat stress, vibrations and impacts from the outside.

In addition, it is also desirable to further provide a groove on the upper surface of the mold part 140 so that the lower end of the lens 150 is inserted into the upper surface of the mold part 140 to be mechanically assembled or bonded by an adhesive.

Figure 7:
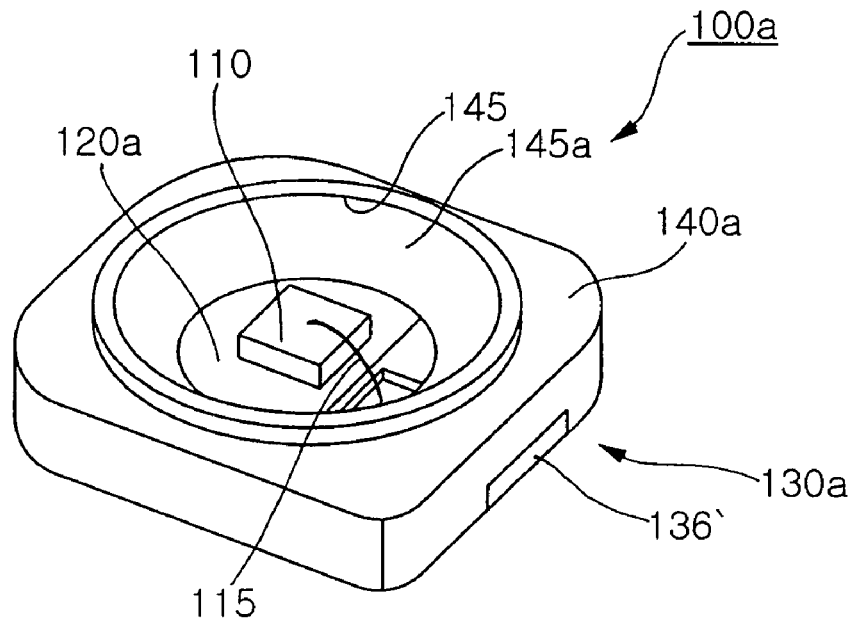
FIG. 7 illustrates a high-power LED package according to a second embodiment of the present invention, in which (a) is a top perspective view, and (b) is a bottom perspective view.
Figure 7:
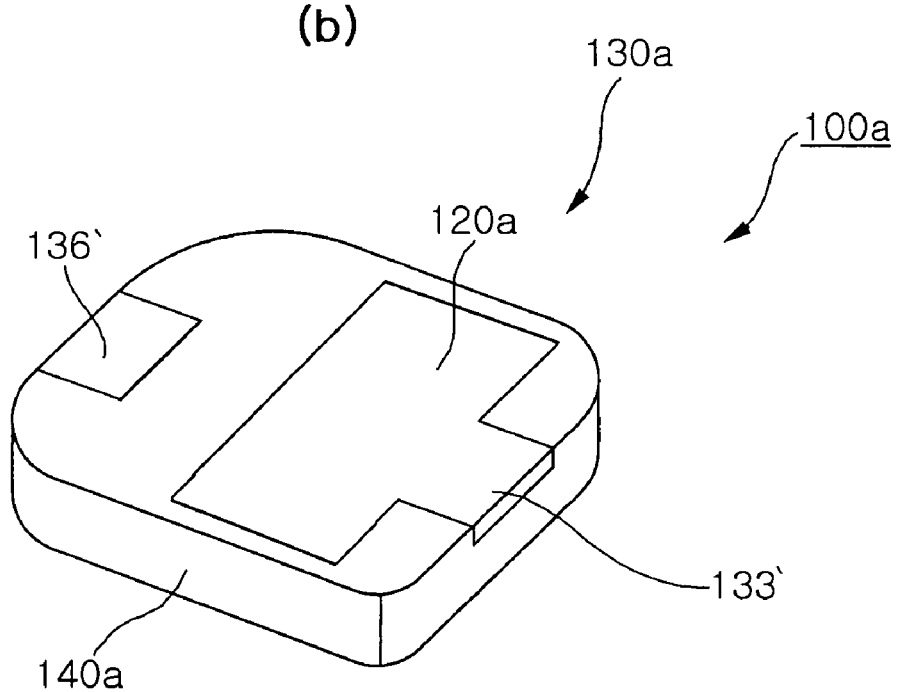
Figure 8:
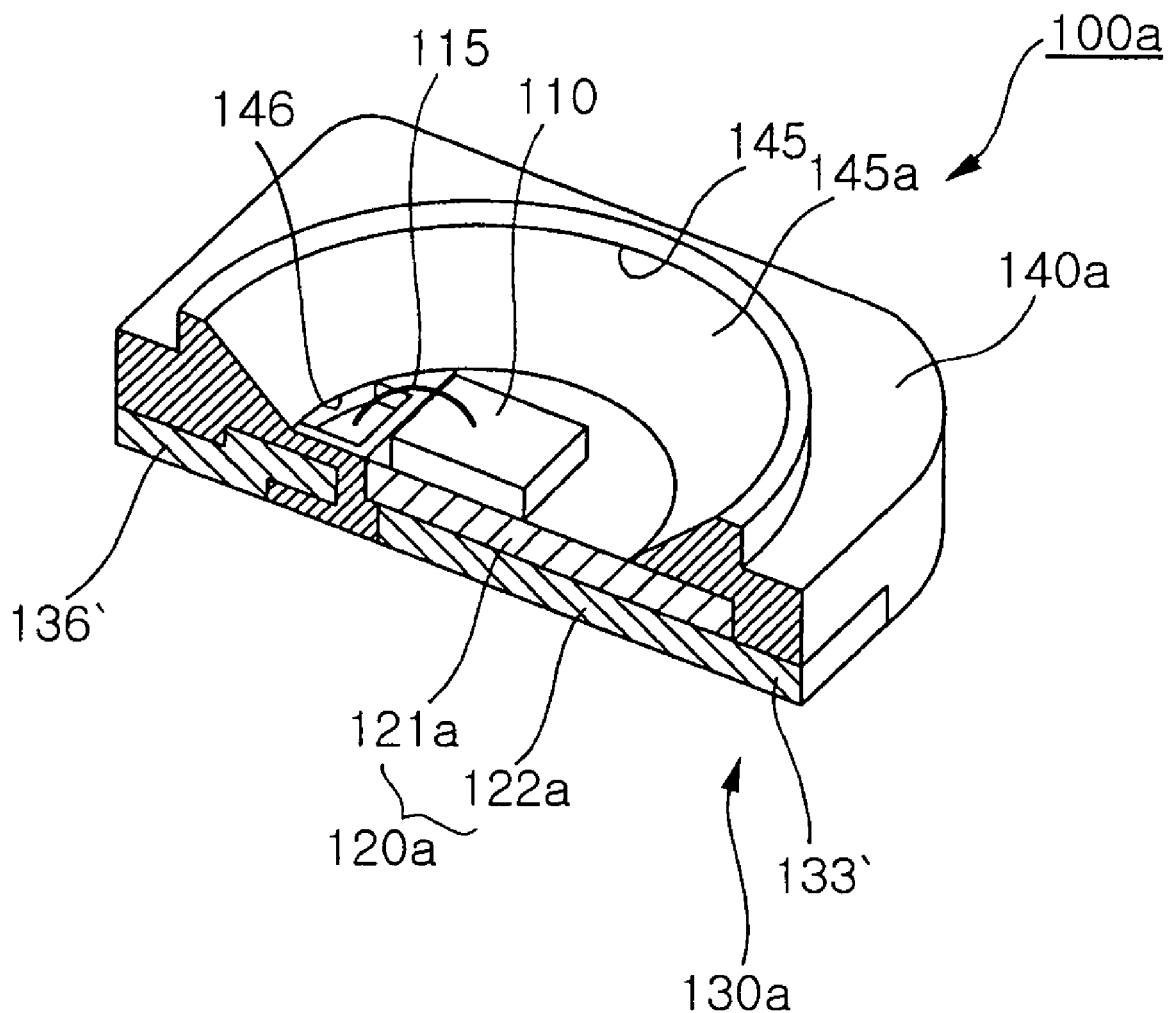
FIG. 8 is a longitudinal sectional view illustrating the high power LED package mounted on the board according to the second embodiment of the present invention.

FIGS. 7(a) and (b) are perspective views illustrating the high power LED package according to a second embodiment of the present invention, and FIG. 8 is a longitudinal sectional view illustrating the high power LED package according to the second embodiment of the present invention.

The constituent parts of the LED package 100a according to the present invention, which are the same as those of the LED package of the first embodiment are denoted with the same reference numerals with the detailed explanation thereof omitted.

The heat conducting member 120a with the light emitting part 110 mounted thereon is composed of the upper and lower metal layers 121a and 122a. The lead part 130a includes the first lead 133' extended from the lower metal layer 122a and the second lead 136' completely separated from the heat conducting member 120a and connected with the light emitting part 110 via wires 115.

Here, the first and second leads 133' and 136' are exposed through the floor surface and the outer surface of the mold part 140a which is injection-molded to integrally fix the heat conducting member 120a and the lead part 130a.

In addition, it is preferable that the mold part 140a is molded in the substantially coplanar with the exposed surfaces of the heat conducting member 120a so that the mold part 140a and the heat conducting member 120a surrounded by the mold part 140a provide a smooth outer peripheries.

Figure 9:
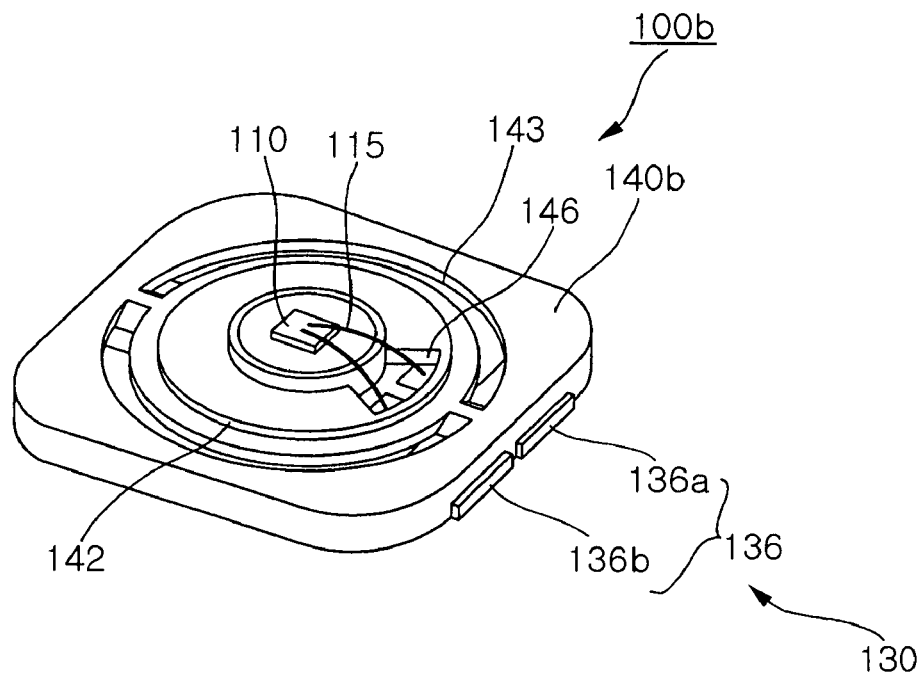
FIG. 9 illustrates a high power LED package according to a third embodiment of the present invention, in which (a) is a top perspective view, and (b) is a bottom perspective view.
Figure 9:
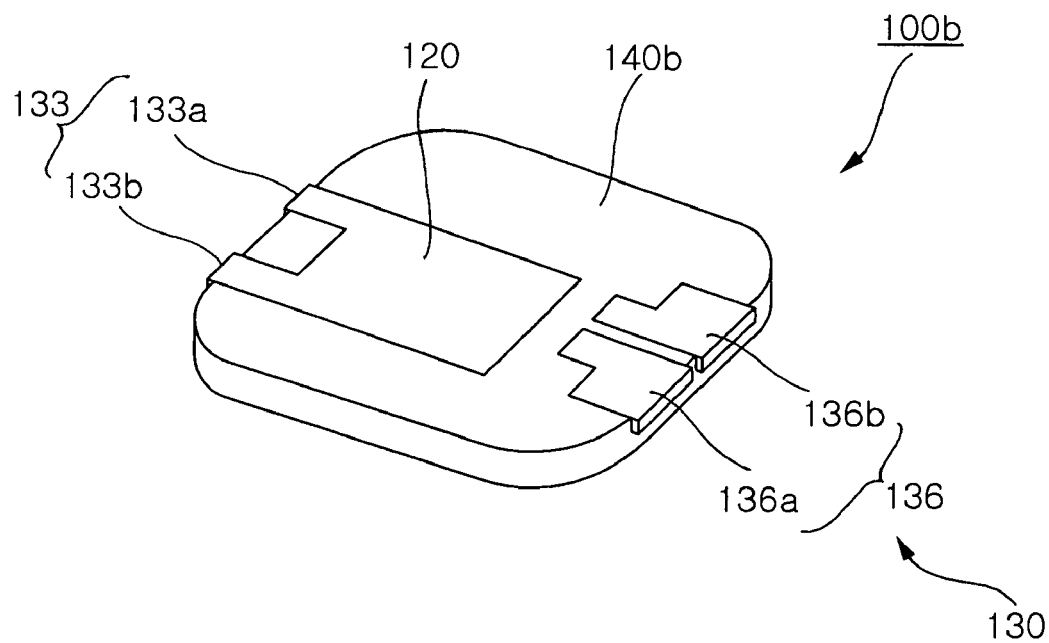
Figure 10:
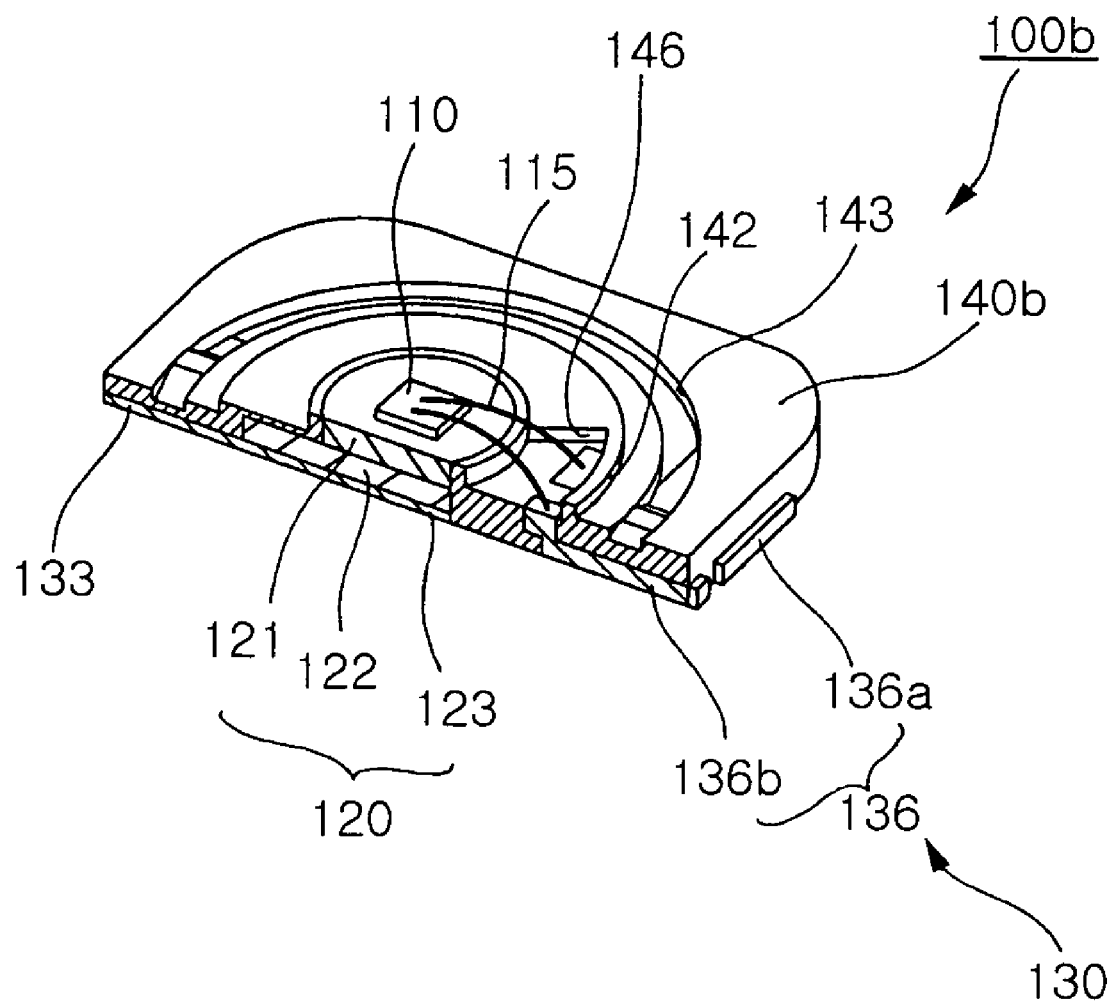
FIG. 10 is a longitudinal sectional view illustrating a high power LED package according to a third embodiment of the present invention.
Figure 11:
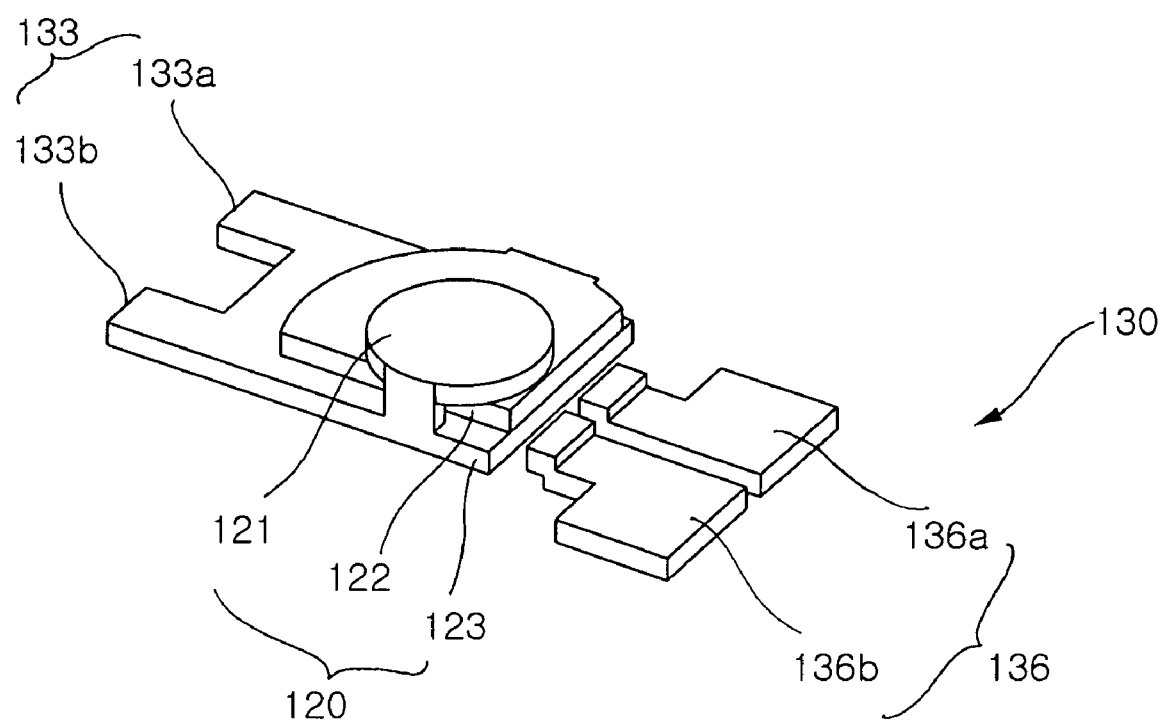
FIG. 11 is a perspective view illustrating a heat conducting member adopted in the high-power LED package, according to the third embodiment of the present invention.

FIGS. 9(a) and (b) are perspective views illustrating a high power LED package according to a third embodiment of the present invention, FIG. 10 is a longitudinal sectional view illustrating the high power LED package according to the third embodiment of the present invention, and FIG. 11 is a perspective view illustrating a heat conducting member adopted in the high-power LED package according to the third embodiment of the present invention.

The constituent parts of the LED package 100b of the present invention, which are the same as the first and second embodiments are denoted with the same reference numerals with the explanation thereof omitted.

The heat conducting member 120 with the light emitting part 110 mounted thereon is composed of the middle metal layer 122 with the upper and lower metal layers 121 and 123 adhered to the upper and lower surfaces of the middle metal layer 122, respectively. The areas of the metal layers 121, 122 and 123 are increased from the upper layer to the lower layer.

In addition, the upper surface of the heat conducting member 120 with the light emitting part 110 mounted thereon may be protruded beyond the upper surface of the mold part 140b which is injection-molded to integrally fix the heat conducting member 120 and the lead part 130.

In this case, the upper end of the heat conducting member 120 is protruded in a predetermined height from the upper surface of the mold part 140b so that the height of the uppermost surface of the mold part 140b has a predetermined difference from that of the upper surface of the heat conducting member 120, where the light emitting part 110 mounted thereon. Thus, the light from the light emitting part 110 has a beam angle of at least 180 degrees, with increased illumination efficiency.

In addition, the supplemental cup part 146 is provided on the upper surface of the mold part 140b to expose a portion of the second lead 136 which is connected to an end of the wire 115 connected to the light emitting part 110 with its the other end.

In addition, an assembly step 142 is protruded such that it is assembled into the inner periphery of the lower end of the lens when the lens 150 is bound to the mold part 140b. On the outer side of the assembly step 142, a groove 143 is provided in a predetermined depth to prevent the excess packing material from flowing outside after filling up the space between the lens 150 and the mold part 140b.

Here, it is preferable that the groove 143 is provided in a continuous or discontinuous form along the outer periphery of the lower end of the lens 150.

FIGS. 12a to 12e are process diagrams illustrating the fabrication method of the high power LED package. The high power LED package 100 is fabricated through the steps a to g explained below.

a. Forming Spread-Out Heat Conducting Member and Lead Part

Figure 12A:
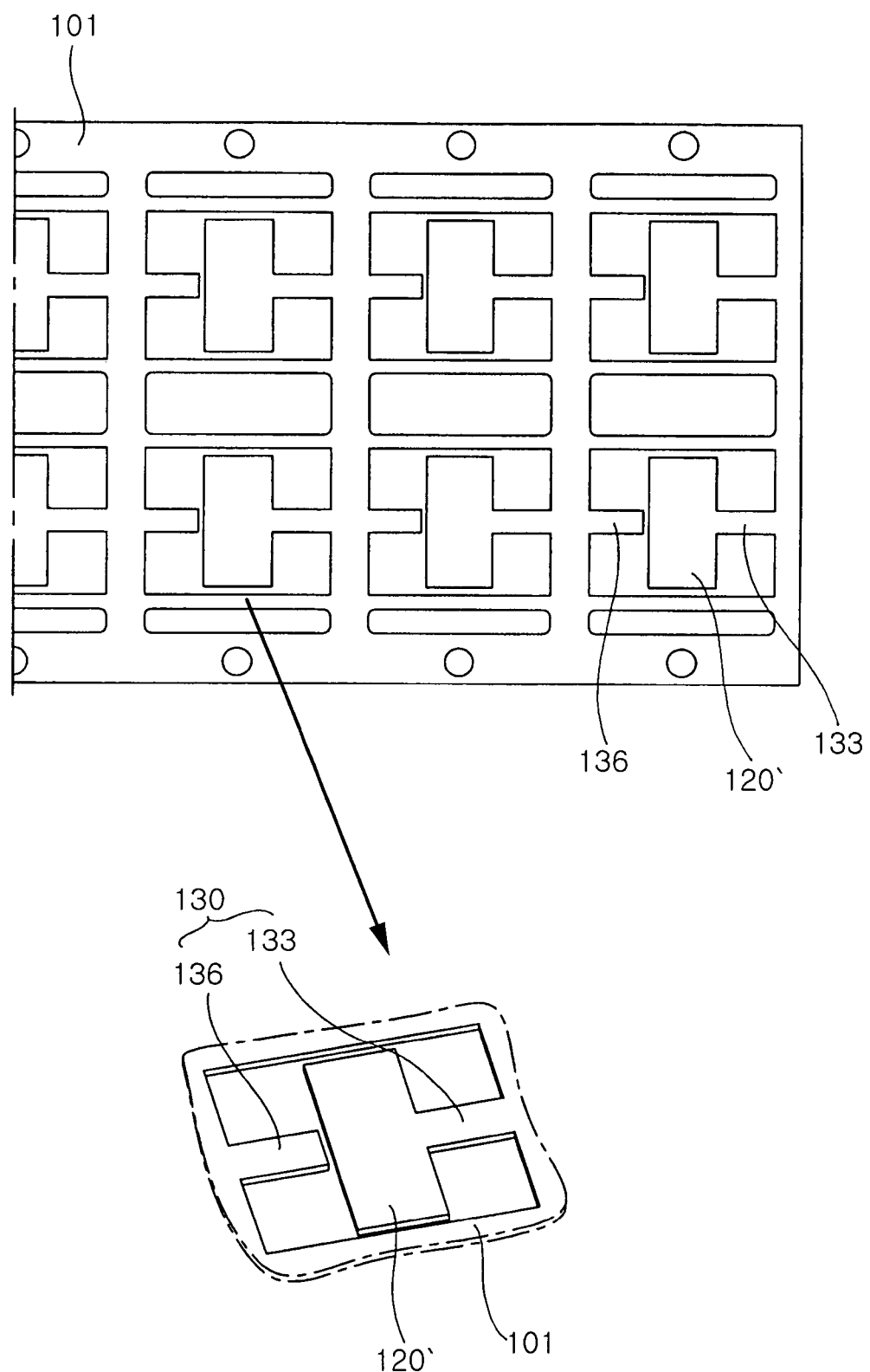
FIGS. 12a to 12e illustrate the fabrication process of the high-power LED package according to the present invention.

As shown in FIG. 12a, punching or blanking is performed to provide a frame part 101 made of a metal plate having a plurality of portions each including a spread-out heat conducting member 120 for forming multiple metal layers and a lead part 130 having a first lead 133 extended from the spread-out heat conducting member 120' and a second lead 136 completely separated from the spread-out heat conducting member.

At this time, while the end portion of the heat conducting member 120' is separated from an end portion of the lead part, they are made of a single metal plate of the frame part 101.

b. Folding Heat Conducting Member to Form Metal Layers

Figure 12B:
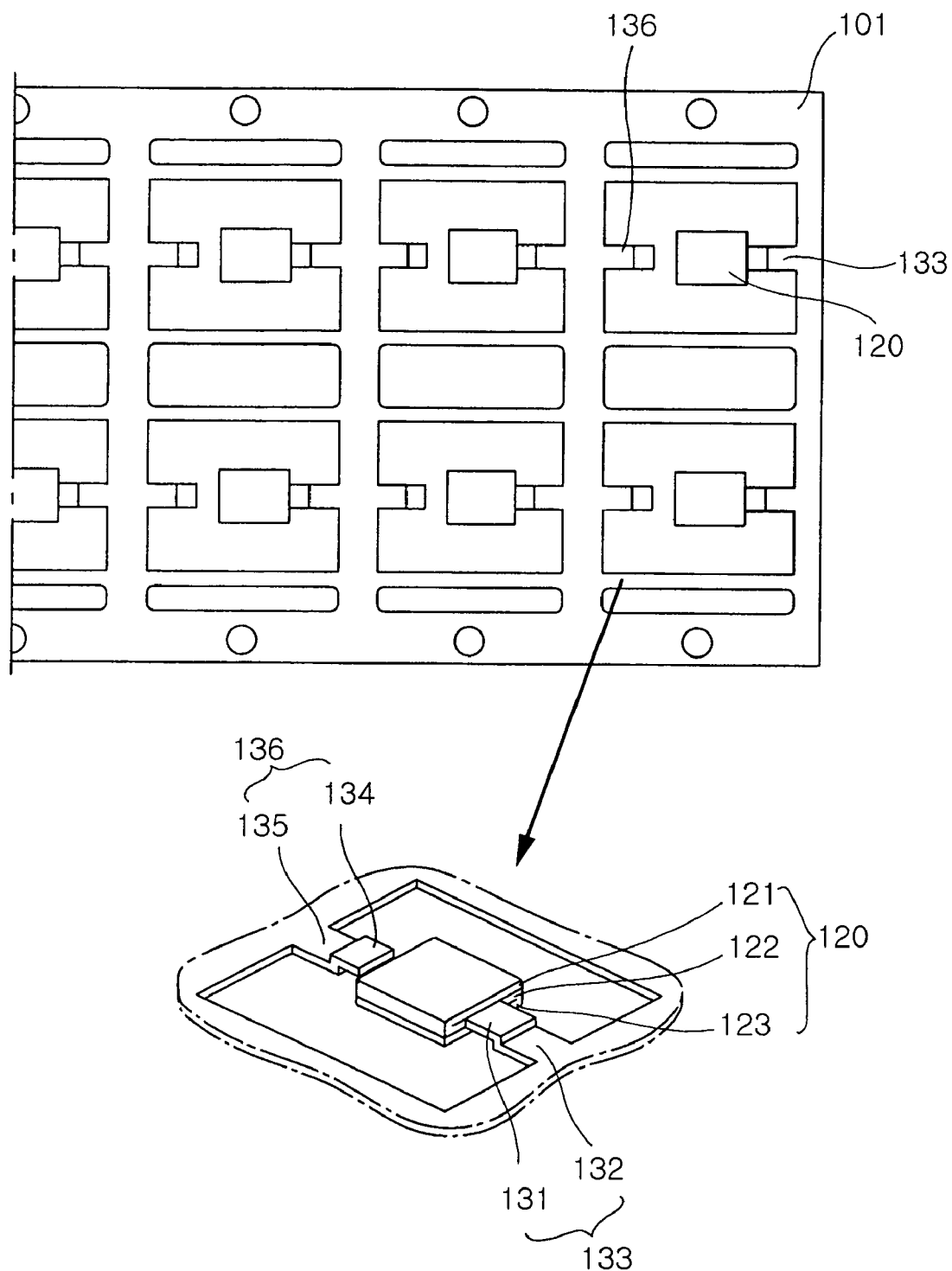

As shown in FIG. 12(b), one end portion of the spread-out heat conducting member 120' in the frame part 101, corresponding to the upper metal layer 121, is folded upward in 180 degrees along an imaginary fold line drawn on the metal plate to be superimposed on the upper surface of the middle layer 122, and the other end portion thereof, corresponding to the lower metal layer 123, is folded along another fold line to be superimposed beneath the surface of the middle layer 122.

Thus, the heat conducting member 120 is realized into a multi-level heat conducting means made of at least two metal layers extended from a single metal plate, folded and superimposed on one another in a height direction.

Figure 13:
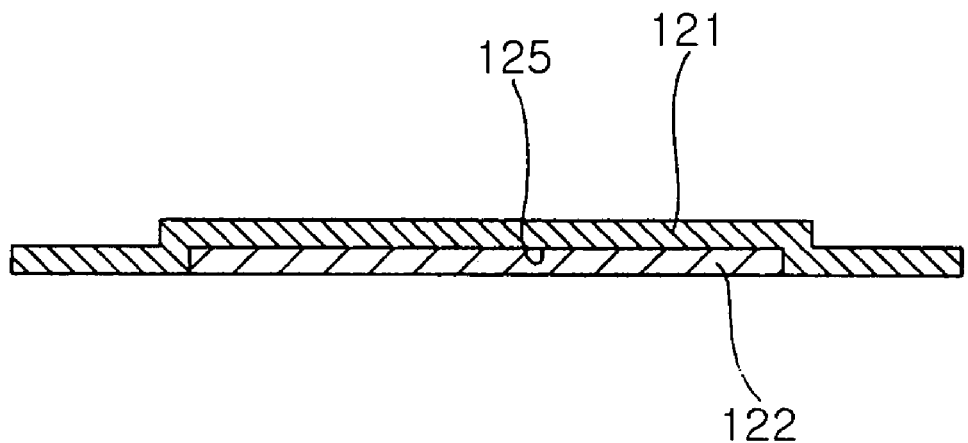
FIGS. 13(a) and (b) are block diagrams illustrating exemplary ways to bind the metal layers of the heat conducting member according to the present invention.
Figure 13:
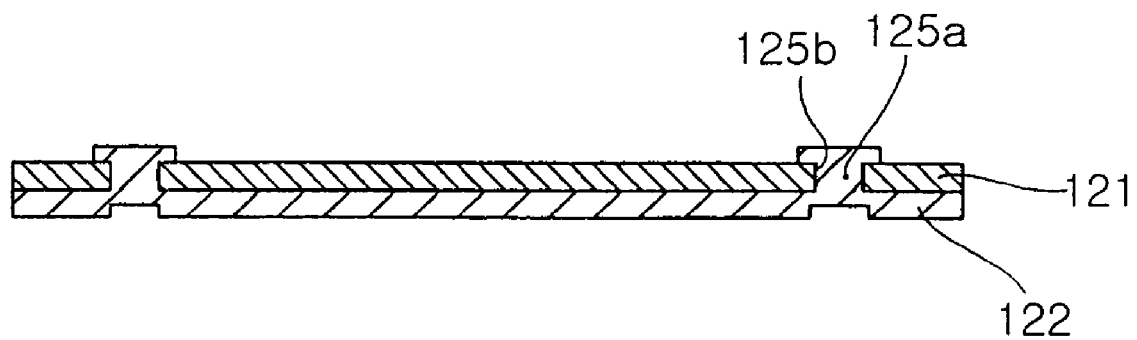

Here, in order to transmit the heat generated from the light emitting part 110 toward the board M, the metal layers of the heat conducting member 120 can be integrated by optionally adopting one of the following methods: forming a recess 125 on the lower surface of the upper metal layer 121 and inserting the middle metal layer 122 or the lower metal layer 123 to integrally bind the superimposed metal layers as shown in FIG. 13(a); and forming a plurality of rivet holes 125a in the upper metal layer 121, forming rivet projections 125b on the lower metal layer, and compressing the upper ends of the rivet projections 125b inserted into the rivet holes 125a to integrally bind the superimposed metal layers as shown in FIG. 13(a).

Also, the metal layers 121, 122, and 123 can be integrally bound via heat fusion in which the interfaces between the metal layers are directly applied with heat of a predetermined temperature or above to be melt and bound together.

Here, the heat for integral binding of the metal layers may be applied via one selected from a group including resistance welding, hot press welding, ultrasonic welding and radio frequency welding.

In addition, the metal layers of the heat conducting member 120 can be integrally bound by a metal medium provided between the layers. Such a metal medium includes a coating material applied on the surface of the metal layer, and paste or metal sheet interposed between the metal layers.

In the meantime, the first lead 133 extended from the heat conducting member 120 and the second lead 136 separated from the heat conducting member 120, both are bent by a press equipment (not shown) to have the upper parts 131 and 134 in the vicinity of the mounting surface of the light emitting part 110 and the lower parts 132 and 135 connected to the upper surface of the board M such that the upper parts 131 and 134 and the lower parts 132 and 135 a predetermined difference in height.

As the first and second leads 133 and 136 are bent, as shown in FIG. 6, they may be cut by a cutting equipment (not shown) such that the end of the first lead 133 has at least two supplemental electrodes 133a and 133b, extended out of the outer surface of the mold part 140, and the end of the second lead 136 has at least two divided electrodes 136a and 136b extended out of the outer surface of the mold part 140.

c. Forming Mold Part to Integrally Fix Heat Conducting Member and Lead Part

Figure 12C:
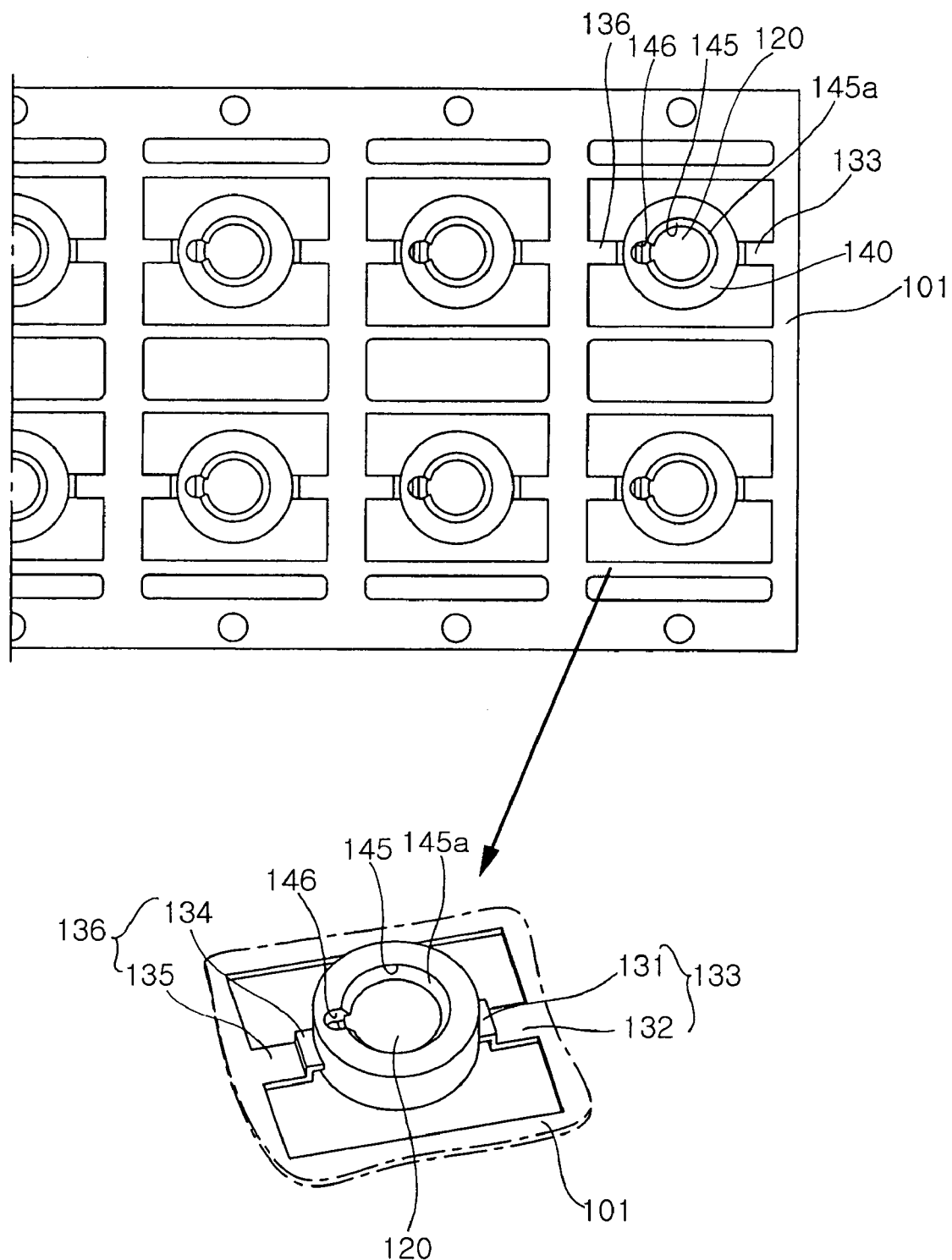

After the folding procedure for the heat conducting member 120 to obtain a multiple-layer structure and the bending procedure for the lead part 130 are complete, as shown in FIG. 12c, the frame part 101 including the heat conducting member 120 and the lead part 130 is disposed in a metal mold and resin is injected into the metal mold to thereby mold the mold part 140 for integral binding of the heat conducting member 120 with the lead part 130.

In the mold part 140, a main cup part 145 is formed to surround and expose the light emitting part 110 mounted on the upper surface of the heat conducting member and a supplemental cup part 146 is formed to expose a portion of the second lead 136 connected to the light emitting part 110 through the medium of a wire 115.

In addition, the inner surface of the main cup part 145 is composed of a sloped surface having a reflective film 145a. Thus, the light provided from the light emitting part 110 mounted on the heat conducting member 120 is concentrated forward to be projected.

Meanwhile, as shown in FIG. 9a, the upper surface of the heat conducting member 110 on which the light emitting part 110 is mounted may be protruded beyond the uppermost surface of the mold part. Thus, the light generated from the light emitting part 110 is projected in a wide beam angle of at least 180 degrees, increasing the illumination efficiency.

In addition, as the mold part is molded, a groove 143 may be formed in a predetermined depth, in the upper surface of the mold part to prevent the excess packing material 155 from flowing outside after filling in the space between the lens 150 and the mold part as shown in FIG. 10.

Thus, when the annular groove 143 is formed on the upper surface of the mold part, corresponding to the outer periphery of the lower end of the lens 150, the packing material 155 leaking from the interface between the lens 150 and the mold part 140 is received in the groove 143 before it flows to outer part of the mold part 140, thereby preventing contamination of the frame part 101.

d. Mounting Light Emitting Part on Upper Surface of Heat Conducting Member

Figure 12D:
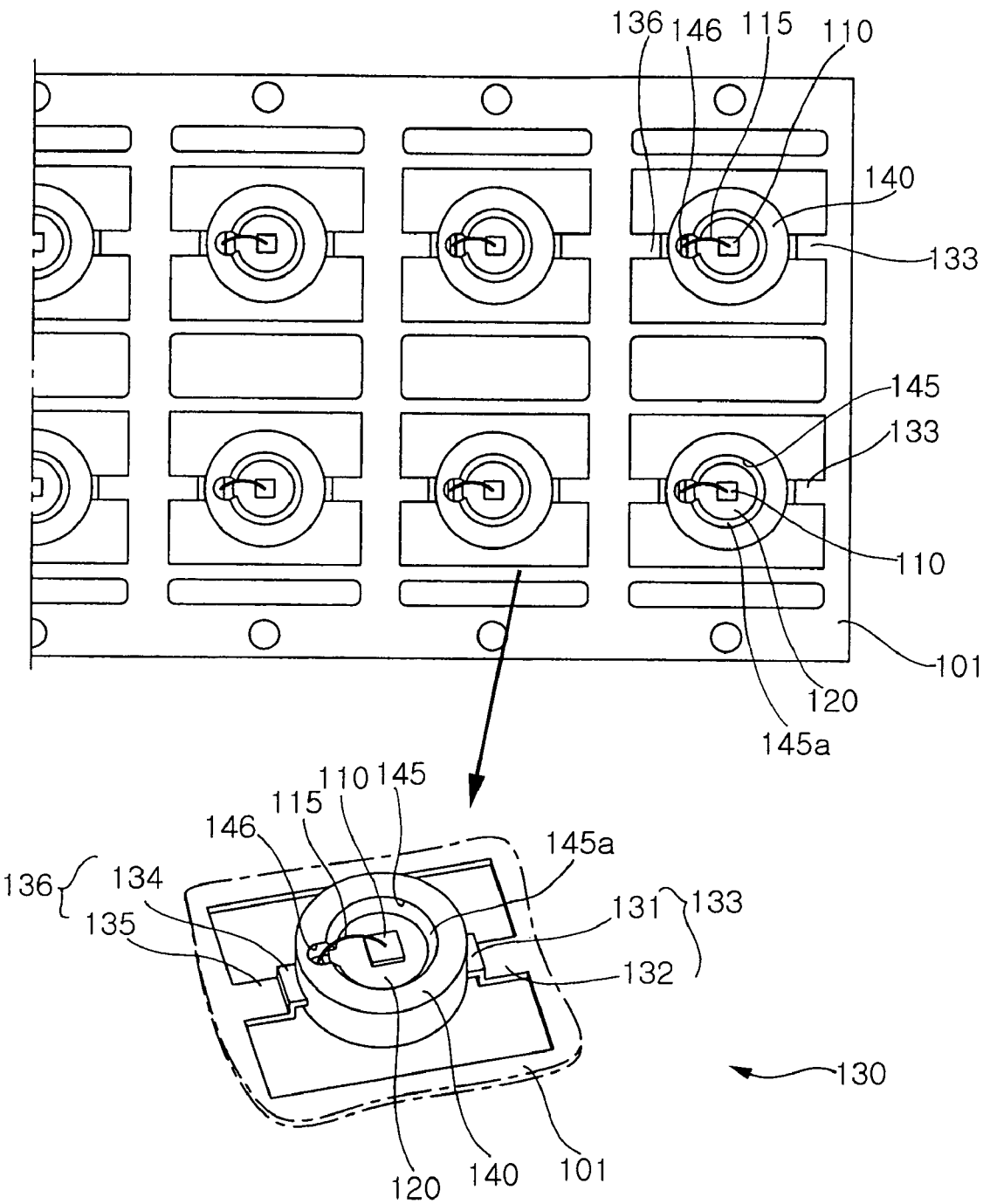

Next, since the upper surface of the heat conducting member 120 is exposed through the main cup part 145 formed in the mold part 140, it is possible to directly mount the light emitting part 110, that is, the semiconductor device in the exact center of the main cup part 145 as shown in FIG. 12d. Alternatively a submount (not shown) having the light emitting part 110 mounted thereon, may be mounted on the upper surface of the heat conducting member 120.

e. Electrically Connecting Light Emitting Part with Lead Part

After the mounting procedure of the light emitting part 110 is complete, as shown in FIG. 12d, an end of the wire 115 is connected to the light emitting part 110, and the other end of the wire 115 is connected to the upper part 134 of the second lead 136 which is exposed through the supplemental cup part 146 of the mold part 140.

As the first lead 133 is extended from the heat conducting member 120, the light emitting part 110 mounted on the heat conducting member 120 is electrically connected with the first lead 133 as well.

f. Binding Lens to Upper Surface of Mold Part

Figure 12E:
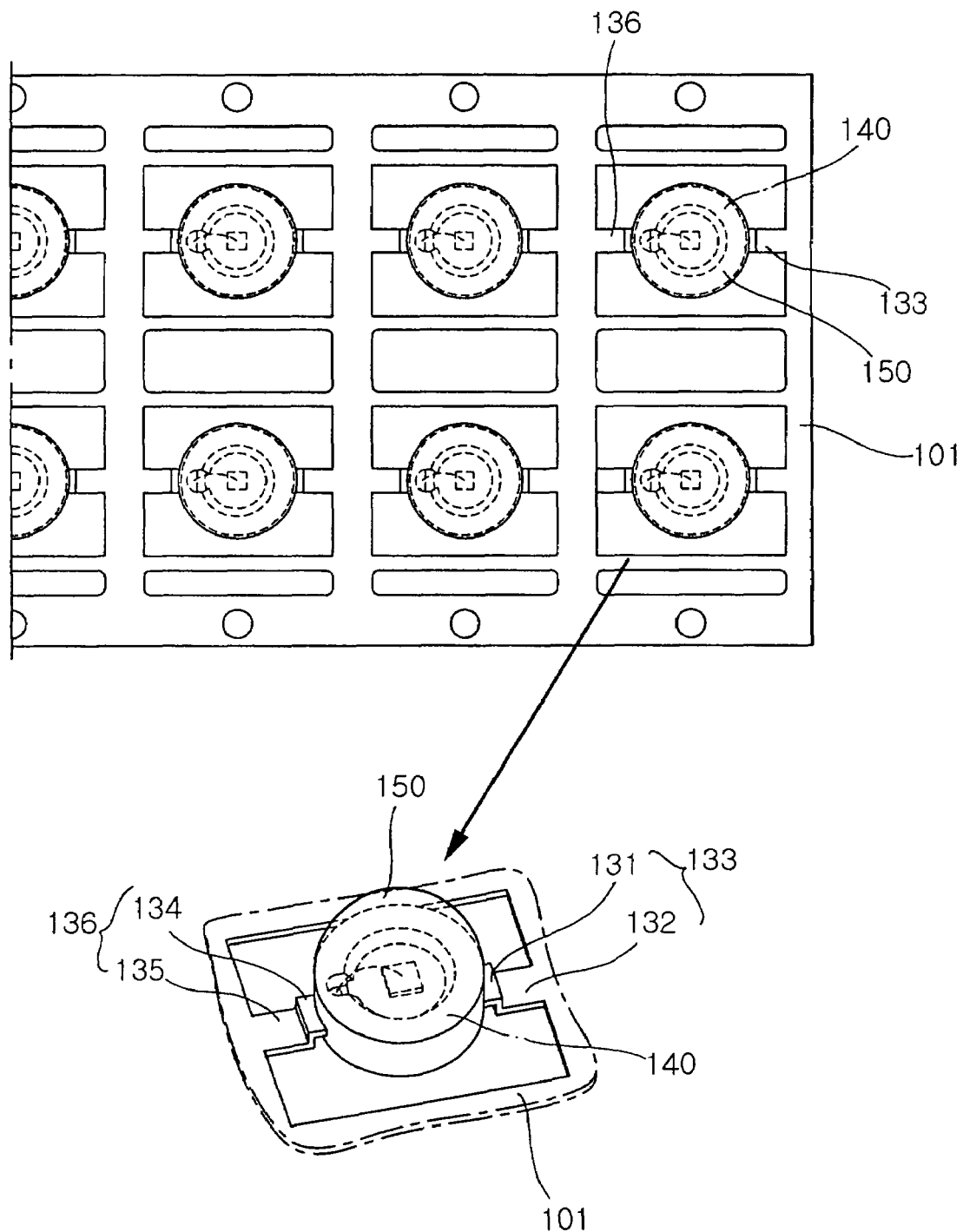

Next, after the electrical connection between the light emitting part 110 of the heat conducting member 120 and the lead part 130 is complete, as shown in FIG. 12e, the lens 150, which is designed to concentrate the light from the light emitting part 110 to the outside or project in a wide range, is positioned right above the light emitting part. Keeping the light emitting part in this position, the lower end of the lens 150 is bound to the upper surface of the mold part 140 using an adhesive.

At this time, the packing material 155 fills the space between the mold part 140 and the lens 150. The packing material 155 leaking from the interface between the lens 150 and the mold part 140 is naturally received in the groove 143 formed in the upper surface of the mold part 140, and thereby preventing contamination of the frame part 101.

g. Cutting Lead Part to Separate Mold Part from Frame Part

After the binding procedure of the mold part 140 and the lens 150 is complete, the first and second leads 133 and 136 which are extended out of the outer surface of the mold part 140 are trimmed using a cutter (not shown).

At this time, it is preferable that the first and second leads 133 and 136 are cut in most close proximity to the outer surface of the mold part 140 to minimize the volume of the package.

After the cutting procedure of the first and second leads 133 and 136 is complete, the mold part molded with the heat conducting member 120 having the light emitting part 110 mounted thereon is separated from the frame part 101, and thus the LED package 100 with the lens 150 bound together with the mold part 140 is completed.

In the present invention as set forth above, the heat conducting member with the light emitting part mounted thereon is integrated with the lead part electrically connected to the light emitting part into a single component. Thus, there is no need to fabricate and machine the heat conducting member beforehand, and assemble the individually fabricated heat conducting member into the mold part. Thus, the present invention allows decrease in the number of constituting components, simplifying the assembly process, thereby increasing productivity and reducing the manufacturing costs.

While the present invention has been shown and described in connection with the preferred embodiments, it will be apparent to those skilled in the art that modifications and variations can be made without departing from the spirit and scope of the invention as defined by the appended claims.

What is claimed is:

1. A high power light emitting diode package comprising:
a light emitting part for emitting light in response to power applied thereto;
a heat conducting member with the light emitting part mounted on an upper surface thereof;
a lead part for electrically connecting the light emitting part with a board; and
a mold part for integrally fixing the heat conducting member and the lead part,
wherein the heat conducting member comprises at least two metal layers deposited in a height direction, and the metal layers are formed by folding over a single metal plate along predetermined fold lines such that the surfaces of the metal layers are in surface contact with each other, and
wherein the lead part comprises at least one first lead extended from one of the, metal layers, and at least one second lead separate from the heat conducting member, thereby forming the heat conducting member integrally with the first lead.

2. The high power LED package according to claim 1, wherein the light emitting part comprises at least one semiconductor device.

3. The high power LED package according to claim 1, wherein the heat conducting member and the lead part are made of heat conductive metal.

4. The high power LED package according to claim 1, wherein the heat conducting member comprises upper, lower and middle metal layers folded from a metal plate.

5. The high power LED package according to claim 4, wherein the upper and lower metal layers are provided in substantially the same area as the area of the upper surface of the middle metal layer.

6. The high power LED package according to claim 4, wherein the upper metal layer is provided in a smaller area than the area of the upper surface of the middle metal layer and in a larger area than the mounting area of a light emitting part.

7. The high power LED package according to claim 4, wherein the upper and lower metal layers and the middle metal layer are bound integrally at interfaces thereof.

8. The high power LED package according to claim 1, wherein the heat conducting member is bound to an upper surface of the board by a conductive adhesive.

9. The high power LED package according to claim 8, wherein the lower surface of the heat conducting member is coplanar with the lower surface of the mold part.

10. The high power LED package according to claim 8, wherein the underside of the heat conducting member is externally exposed through an opening perforated in the underside of the mold part.

11. The high power LED package according to claim 8, wherein the underside of the heat conducting member protrudes through the underside of the mold part.

12. The high power LED package according to claim 1, wherein the heat conducting member is adjustable in height by the number of the folded metal layers.

13. The high power LED package according to claim 1, wherein the first and second leads are opposed to each other with respect to the heat conducting member.

14. The high power LED package according to claim 1, wherein each of the first and second leads has an upper part, which is in the vicinity of the mounting surface of the light emitting part, and a lower part, which is in contact with the upper surface of the board, the upper part and the lower part having different heights.

15. The high power LED package according to claim 1, wherein the first lead is integrally provided with at least two supplemental electrodes at an outer end thereof, extended out of the outer surface of the mold part.

16. The high power LED package according to claim 1, wherein the second lead comprises at least two divided electrodes extended out of the outer surface of the mold part.

17. The high power LED package according to claim 1, wherein the lead part is extended out of the outer surface of the mold part to have a minimum contact area electrically connected to a pattern circuit of the board.

18. The high power LED package according to claim 1, wherein the mold part includes a main cup part having a reflective film on a sloped surface surrounding the light emitting part.

19. The high power LED package according to claim 1, wherein the mold part includes a supplemental cup part which exposes a portion of the second lead connected with an end of a wire having the other end electrically connected with the light emitting part.

20. The high power LED package according to claim 1, wherein the mold part is made of heat conductive resin.

21. The high power LED package according to claim 1, wherein the mold part has outer surfaces substantially coplanar with exposed side or bottom surfaces of the heat conducting member.

22. The high power LED package according to claim 1, wherein an upper surface of the heat conducting member where the light emitting part is mounted is protruded beyond an uppermost surface of the mold part.

23. The high power LED package according to claim 1, further comprising a lens provided on an upper surface of the mold part, covering an upper part of the light emitting part.

24. The high power LED package according to claim 23, comprising packing material provided between the mold part and the lens, filling the space therebetween.

25. The high power LED package according to claim 23, wherein the mold part has a groove in an upper surface thereof for preventing excess packing material from overflowing outside after filling in the space between the lens and the mold part as the lens is bonded to the mold part.

26. The high power LED package according to claim 25, wherein the groove is provided along the outer periphery of the lower end of the lens.

27. A fabrication method of a high power LED package comprising steps of:
   a) forming a spread-out heat conducting member made of a metal plate and a lead part comprising a first lead extended from the spread-out heat conducting member and a second lead separate from the heat conducting member in a plate-shaped frame part;
   b) folding the spread-out heat conducting member along a fold line into at least two metal layers to form a heat conducting member made of the metal layers extended from the single metal plate, folded and superimposed on one another in a height direction;
   c) molding a mold part to integrally fix the heat conducting member and the lead part;
   d) mounting a light emitting part on an upper part of the heat conducting member;
   e) electrically connecting the light emitting part and the lead part;
   f) bonding the lens to an upper surface of the mold part; and
   g) cutting the lead part to separate the mold part from the frame part.

28. The fabrication method according to claim 27, wherein the step (b) comprises forming a recess on a lower surface of one of the metal layers and inserting another one of the metal layers into the recess for integral binding of the metal layers.

29. The fabrication method according to claim 27, wherein the step (b) comprises directly melting and bonding, by heat-fusion, the interfacial surfaces between the metal layers to integrally bind the metal layers.

30. The fabrication method according to claim 29, wherein heat is applied between the metal layers via one selected from a group consisting of resistance welding, hot press welding, ultrasonic welding, and radio frequency welding.

31. The fabrication method according to claim 27, wherein the step (b) comprises integrally binding the metal layers by a metal medium provided between the metal layers.

32. The fabrication method according to claim 31, wherein the metal medium comprises a coating material applied on the surface of the metal layer.

33. The fabrication method according to claim 31, wherein the metal medium comprises a paste or a metal sheet interposed between the metal layers.

34. The fabrication method according to claim 27, wherein the step (b) comprises bending the first and second leads such that upper and lower parts of each of the first and second leads have different heights.

35. The fabrication method according to claim 27, wherein the step (b) comprises cutting an outer end of the first lead extended out of the outer surface of the mold part to form at least two supplemental electrodes.

36. The fabrication method according to claim 27, wherein the step (b) comprises cutting an outer end of the second lead extended out of the outer surface of the mold part to form at least two divided electrodes.

37. The fabrication method according to claim 27, wherein the step (c) comprises forming a main cup part surrounding the light emitting part to be mounted on an upper surface of the heat conducting member.

38. The fabrication method according to claim 37, wherein the inner surface of the main cup part comprises a sloped surface with a reflective film thereon.

39. The fabrication method according to claim 27, wherein the step (c) comprises forming a supplemental cup part which externally exposes a portion of the second lead connected with the light emitting part by a wire.

40. The fabrication method according to claim 27, wherein the step (c) comprises molding the mold part such that an upper surface of the heat conducting member where the light emitting part is mounted is protruded beyond an uppermost surface of the mold part.

41. The fabrication method according to claim 27, wherein the step (c) comprises forming a groove in the upper surface of the mold part for preventing excess packing material from overflowing outside after filling in the space between the lens and the mold part as the lens is bonded to the upper surface of the mold part.

42. The fabrication method according to claim 27, wherein the step (g) comprises cutting the first and second leads in most close proximity to the outer surface of the mold part.

43. A fabrication method of a high power LED package comprising steps of:

a) forming a spread-out heat conducting member and a lead part comprising a first lead extended from the spread-out heat conducting member and a second lead separate from the spread-out heat conducting member in a plate-shaped frame part;

b) folding the spread-out heat conducting member into at least two metal layers to form a heat conducting member;

c) molding a mold part to integrally fix the heat conducting member and the lead part;

d) mounting a light emitting part on an upper part of the heat conducting member;

e) electrically connecting the light emitting part and the lead part;

f) bonding the lens to an upper surface of the mold part; and g) cutting the lead part to separate the mold part from the frame part, wherein the step (b) comprises forming a plurality of rivet holes through one of the metal layers, forming rivet projections on another one of the metal layers, superimposing the metal layers so that the rivet projections are inserted into the rivet holes, and compressing the upper part of the rivet projections inserted into the rivet holes to integrally bind the superimposed metal layers.

* * * * *